US009640884B2

(12) United States Patent
Sasame et al.

(10) Patent No.: US 9,640,884 B2
(45) Date of Patent: May 2, 2017

(54) LOW PROFILE CIRCUIT CONNECTOR

(71) Applicants: FCI CONNECTORS SINGAPORE PTE LTD, Singapore (SG); FCI ASIA PTE LTD, Singapore (SG)

(72) Inventors: Naotaka Sasame, Saitama (JP); Takahisa Ishishita, Saitama (JP); Motomu Kajiura, Tokyo (JP)

(73) Assignee: FCI Asia Pte. Ltd., Singapore (SG)

( * ) Notice: Subject to any disclaimer, the term of this patent is extended or adjusted under 35 U.S.C. 154(b) by 0 days.

(21) Appl. No.: 14/784,654

(22) PCT Filed: Apr. 21, 2014

(86) PCT No.: PCT/SG2014/000176
§ 371 (c)(1),
(2) Date: Oct. 15, 2015

(87) PCT Pub. No.: WO2014/171900
PCT Pub. Date: Oct. 23, 2014

(65) Prior Publication Data

US 2016/0079692 A1 Mar. 17, 2016

(30) Foreign Application Priority Data

Apr. 18, 2013 (SG) ................................ 201302958-2

(51) Int. Cl.
*H01R 12/00* (2006.01)
*H05K 1/00* (2006.01)
(Continued)

(52) U.S. Cl.
CPC ......... *H01R 12/721* (2013.01); *H01R 12/772* (2013.01); *H01R 12/778* (2013.01); *H01R 13/6275* (2013.01); *H01R 12/79* (2013.01)

(58) Field of Classification Search
CPC ...... H01R 12/59; H01R 12/77; H01R 12/771; H01R 12/79; H01R 13/518
(Continued)

(56) References Cited

U.S. PATENT DOCUMENTS 7,175,458 B2 * 2/2007 Tsai ........................ H01R 12/88 439/260
7,201,605 B2 * 4/2007 Yamada ................. H01R 12/88 439/495

(Continued)

FOREIGN PATENT DOCUMENTS

| | | |
|---|---|---|
| JP | H03-95584 U | 9/1991 |
| JP | 2008-153059 | 7/2008 |
| JP | 2009-64577 | 3/2009 |

OTHER PUBLICATIONS

Extended European Search Report for European Application No. 14785490.5 dated Oct. 14, 2016.

(Continued)

*Primary Examiner* — Hae Moon Hyeon
(74) *Attorney, Agent, or Firm* — Wolf, Greenfield & Sacks, P.C.

(57) ABSTRACT

An electrical connector includes a housing, contact elements and locking members attached to the housing. The housing has a front end, a back end, a top side, a bottom side and a cavity between the top side and the bottom side. The cavity is to partially receive a circuit board therein. Each contact element is insertable into the housing along a direction from the bottom side towards the top side. Each locking member is insertable into the housing along a direction from the bottom side towards the top side. The upper and lower contact arms and the lock arm are resiliently deflectable away from the cavity to allow insertion of the circuit board into the cavity, and spring back when the circuit board is (Continued)

inserted into the cavity to make electrical connection to the circuit board and to lock the circuit board in the housing.

11 Claims, 12 Drawing Sheets

(51) Int. Cl.

| | |
|---|---|
| ***H01R 12/72*** | (2011.01) |
| ***H01R 12/77*** | (2011.01) |
| ***H01R 13/627*** | (2006.01) |
| *H01R 12/79* | (2011.01) |

(58) Field of Classification Search
USPC ............ 439/67, 77, 492, 495, 355, 354, 260
See application file for complete search history.

(56) References Cited

U.S. PATENT DOCUMENTS

| | | | | |
|---|---|---|---|---|
| 8,052,464 | B2 * | 11/2011 | Maruishi | H01R 12/61 439/496 |
| 2005/0260885 | A1 * | 11/2005 | Lu | H01R 12/79 439/495 |
| 2014/0170867 | A1 * | 6/2014 | Hodge | H01R 12/62 439/67 |

OTHER PUBLICATIONS

International Preliminary Report on Patentability for International Application No. PCT/SG2014/000176 dated Oct. 29, 2015.

* cited by examiner

A-A

B-B

C-C

D-D

LOW PROFILE CIRCUIT CONNECTOR

TECHNICAL FIELD

The present invention relates to an electrical connector and in particular, the present invention relates to an electrical connector for connecting to a flexible printed circuit board.

BACKGROUND

Flexible Printed Circuit (FPC) board or ribbon connectors are used in many electronic devices for establishing electrical connections between different modules/components in the device. To ensure reliable connection, the connector is typically provided with an actuator for physically fixing and locking the FPC to the connector. Actuator is a movable element in an FPC connector, hence to enable effective operation of the actuator, the FPC connector must have a housing structure sufficiently large to physically support the actuator. In applications of compact sized electronic devices, the connectors used in such devices are miniaturized, and the housing of such miniaturized connectors may not have the required dimension, strength and/or rigidity to support an actuator and therefore electrical connection maybe compromised. It is therefore desireable to provide an FPC connector having a compact size and yet is capable to ensure reliable electrical connection with the FPC.

SUMMARY OF INVENTION

Embodiments of the present invention provide connectors for reliably connecting to an FPC without the need of an actuator. The connector can be made low profile, small and thinner to meet miniaturization requirements for use in compact electronics devices. The FPC can be securely fixed to the connector to establish and maintain electrical connection.

In one embodiment, an FPC connector has a housing and contact elements disposed in the housing. The housing has a front end, a back end, a top side, a bottom side and a cavity between the top side and the bottom side. Each contact element has an upper contact arm disposed at the top side and a lower contact arm disposed at the bottom side. The cavity is to receive a circuit board e.g. and FPC therein to establish electrical connection with the upper and lower contact arms. A pair of locking members is attached to the housing. Each locking member has a lock arm positioned along a direction from the back end to the front end of the housing. The upper contact arm and the lower contact arm of each contact element and the lock arm of each locking member are resiliently deflectable away from the cavity to allow insertion of the FPC into the cavity. When the circuit board is inserted into the cavity, the upper contact arm and the lower contact arm are in electrical contact with the FPC, and the lock arm springs back to engage the FPC and lock the circuit board to the housing.

BRIEF DESCRIPTION OF THE DRAWINGS

Embodiments of the invention are disclosed hereinafter with reference to the drawings, in which.

DETAILED DESCRIPTION OF PREFERRED EMBODIMENTS

Figure 1A:
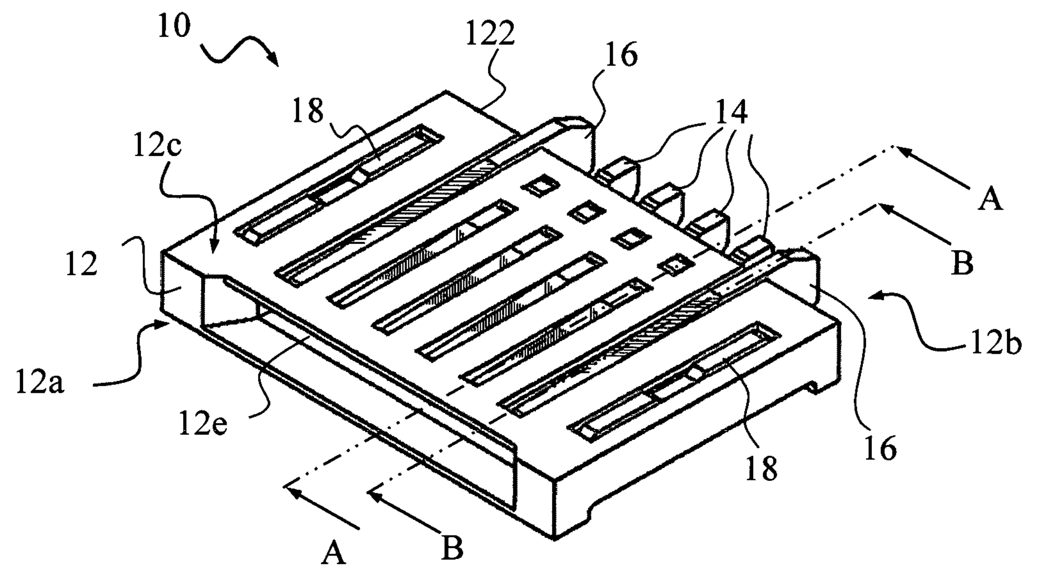
FIG. 1A is a perspective view showing an FPC connector according to one embodiment of the present invention.
Figure 1B:
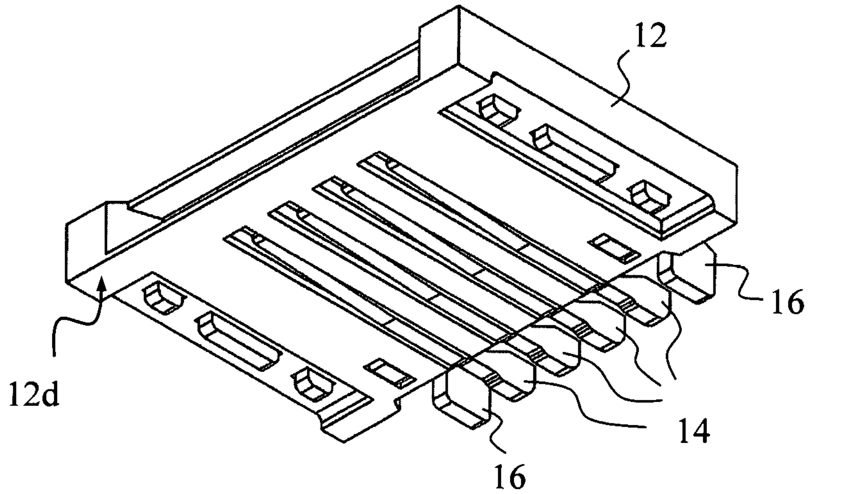
FIG. 1B is a perspective bottom view of FIG. 1A.

As shown in FIG. 1A and FIG. 1B, an FPC connector 10 according to one embodiment of the present invention includes a housing 12, a plurality of contact elements 14, a pair of locking members 16 and a pair of hold downs 18 attached to housing 12. Housing 12 is made of molded plastic and has a front side 12*a*, back side 12*b*, top side 12*c* and bottom side 12*d*. Between top side 12*c* and bottom side 12*d* there is formed a cavity 12*e* for receiving an FPC therein to establish electrical connection.

Figure 2:
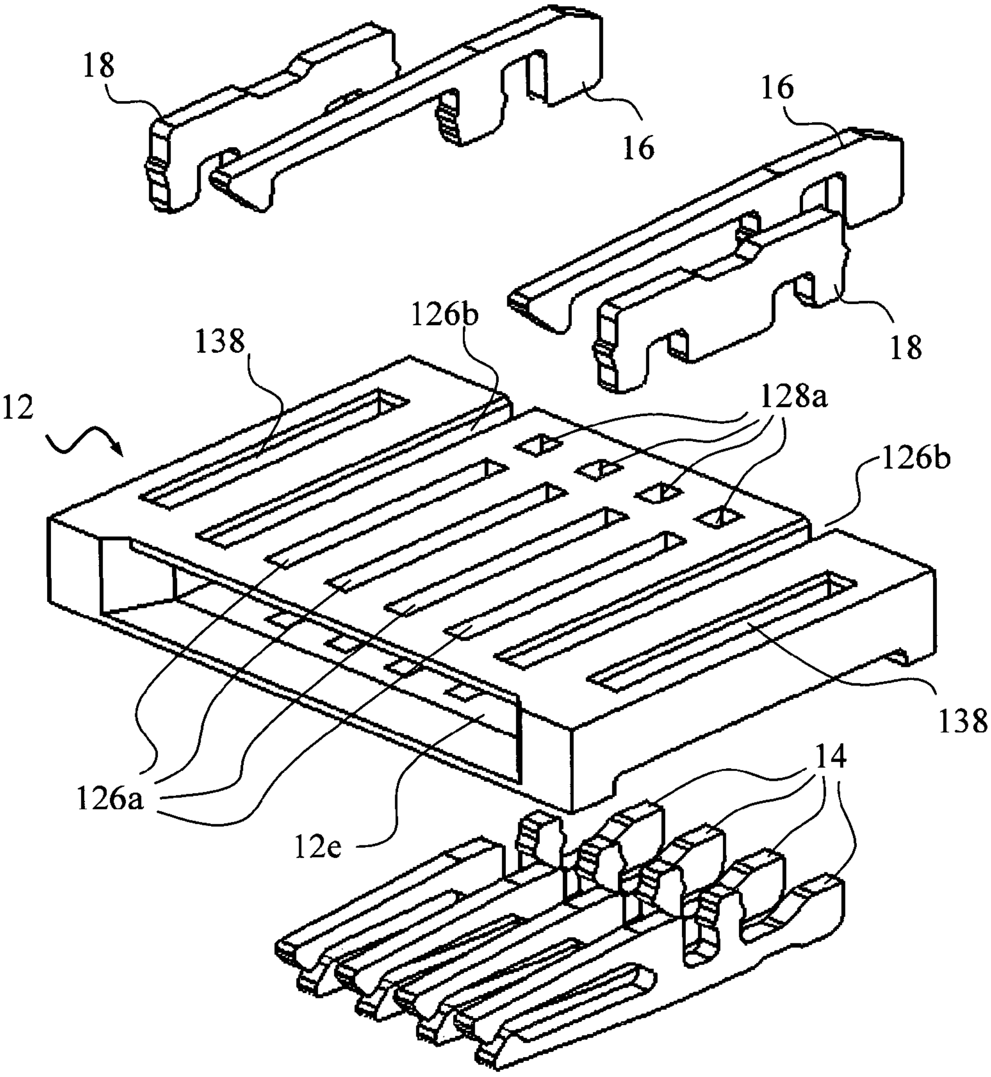
FIG. 2 is an exploded view of FIG. 1A.
Figure 3:
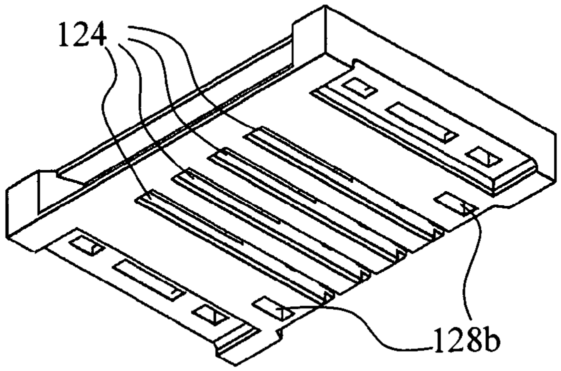
FIG. 3 is a perspective bottom view of the housing of the FPC connector showing in FIG. 1A.

As shown in FIGS. 2 and 3, housing 12 includes first contact grooves 124 formed at bottom side 12*d* and second contact grooves 126*a* formed on top side 12*c*. Formed on top side 12*c* are also fixing grooves 126*b* which extends to back side 12*b* of housing 12. In addition, hold down grooves 138 and fixing recesses 128*a* are formed on top side 12*c*, and fixing holes 128*b* are formed at bottom side 12*d* of housing 12.

Figure 4:
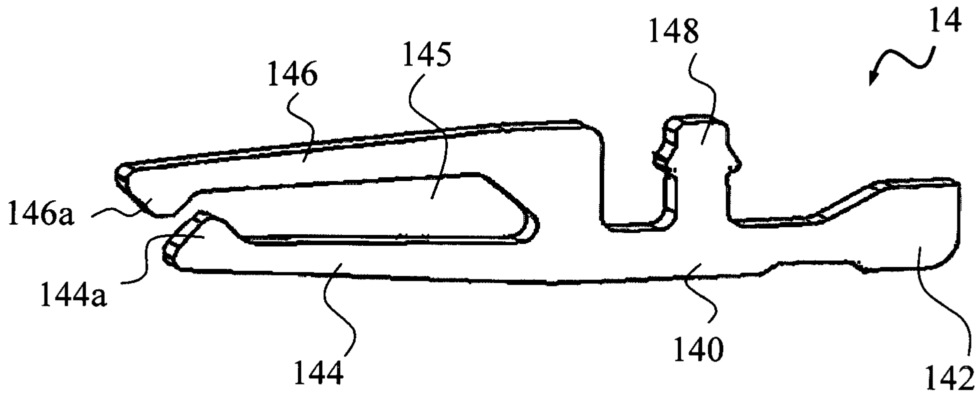
FIG. 4 is a perspective view showing a contact element of the FPC connector showing in FIG. 1A.

As shown in FIG. 4, contact element 14 includes a base 140 and a tail 142 extending from base 140 towards a back side of contact element 140. A lower arm 144 and an upper arm 146 extend from base 140 towards a front side of contact element 140. Lower arm 144 has a lower contact projection 144*a* formed at a free end thereof, facing upper arm 146. Upper arm 146 has an upper contact projection 146*a* formed at a free end thereof, facing lower arm 144. Lower arm 144 and upper arm 146 define a space 145 therebetween for receiving an FPC. A fixing projection 148 is formed on base 140 and extending upwardly from base 140.

Figure 5:
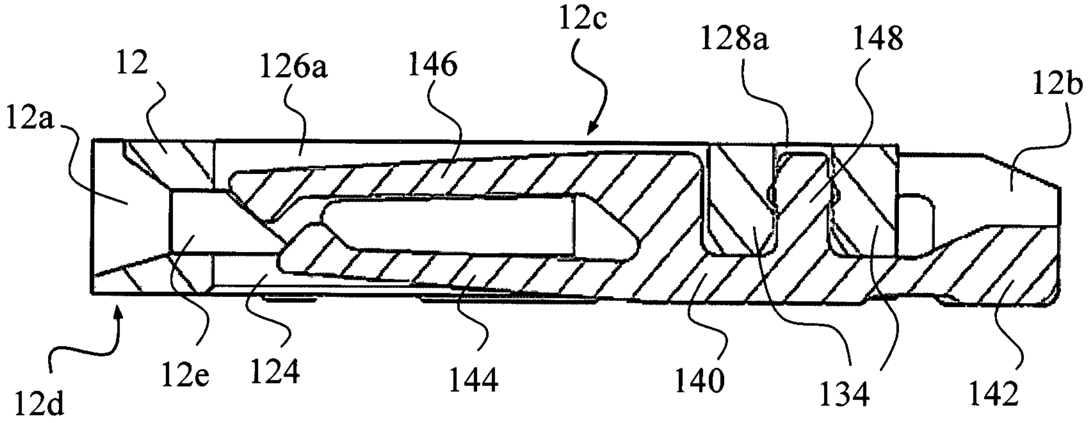
FIG. 5 is a cross sectional view of FIG. 1A along A-A.

To assemble to housing 12, as shown in FIG. 5, each contact elements 14 is inserted and attached to housing 12 from bottom side 12*d* along a direction towards top side 12*c*, with fixing projection 148 inserted into fixing recess 128*a*. During the insertion process, upper arm 146 passes through first contact groove 124 and cavity 12*e*. When fixing projection 148 is fully received in fixing recess 128*a*, upper arm 146 is positioned in second contact groove 126*a*. Base 140 becomes in contact with first stopper(s) 134 formed in housing 12 hence further insertion of contact element 14 toward top side 12*c* is prevented. Meanwhile, lower arm 144 is received in first contact groove 124 and tail 142 is positioned at back side 12*b* of housing 12. Contact elements 14 are attached to housing 12 in this manner. Lower arm 144 is elastically deflectable within first contact groove 124. Likewise, upper arm 146 is elastically deflectable within second contact groove 126*a*.

Figure 6:
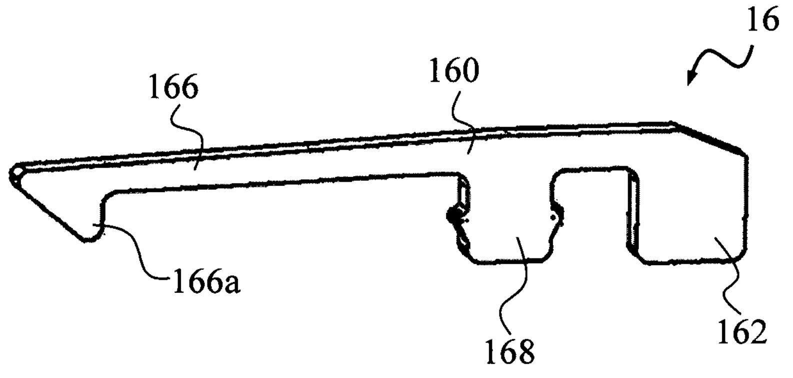
FIG. 6 is a perspective view showing a locking member of the FPC connector showing in FIG. 1A.

As shown in FIG. 6, locking member 16 includes a base 160 and a tail 162 extending backwardly and downwardly from base 160. A locking arm 166 extends forwardly from base 160 and has a catch member 166*a* formed at the free end of locking arm 166. Formed on base 160 there is a locking projection 168 extending downwardly.

Figure 7:
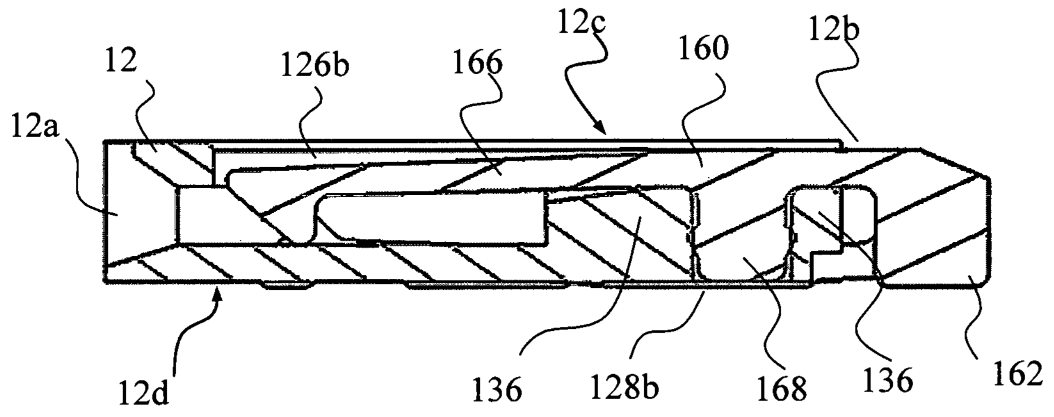
FIG. 7 is a cross sectional view of FIG. 1A along B-B.
Figure 8:
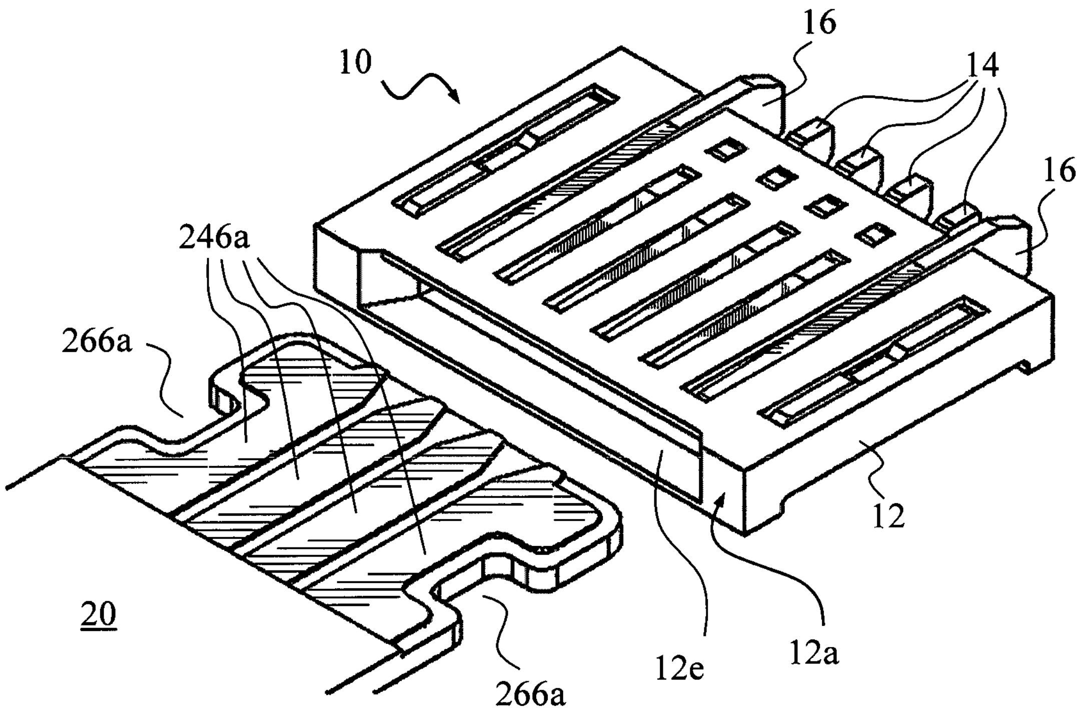
FIG. 8 is a perspective view showing an FPC to be connected to the FPC connector of FIG. 1A.
Figure 9:
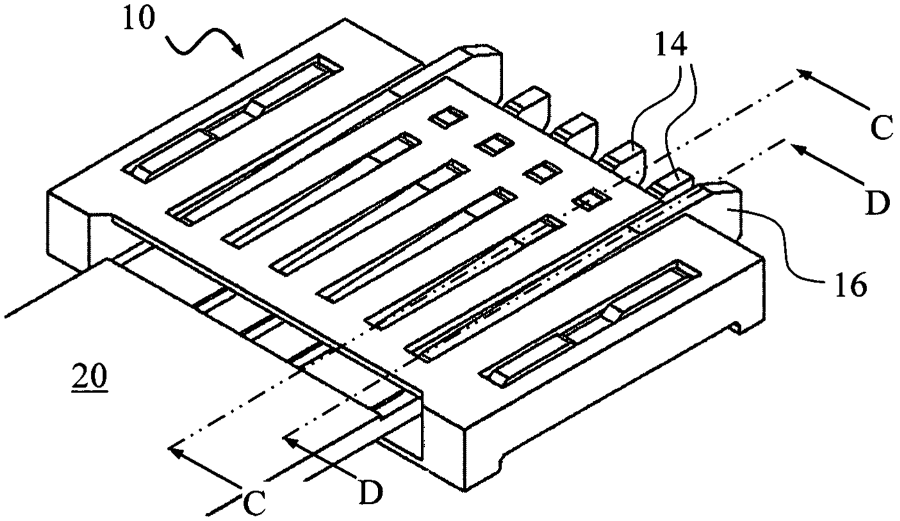
FIG. 9 is a perspective view showing an FPC connected to the FPC connector of FIG. 1A.

To assemble to housing 12, as shown in FIG. 7, each locking member 16 is inserted to housing 12 from top side 12*c* along a direction towards bottom side 12*d*, with locking projection 168 inserted into fixing hole 128*b* of housing 12. When locking projection 168 is fully received in fixing hole 128*b*, locking arm 166 is positioned in fixing groove 126*b*. Base 160 becomes in contact with second stopper(s) 136 formed in housing 12 hence further insertion of locking member 16 toward bottom side 12*d* is prevented. Meanwhile, tail 162 is positioned at back side 12*b* of housing 12. Locking members 16 are attached to housing 12 in this manner, and locking arm 166 is allowed to deflect within fixing groove 126*b*.

Figure 10:
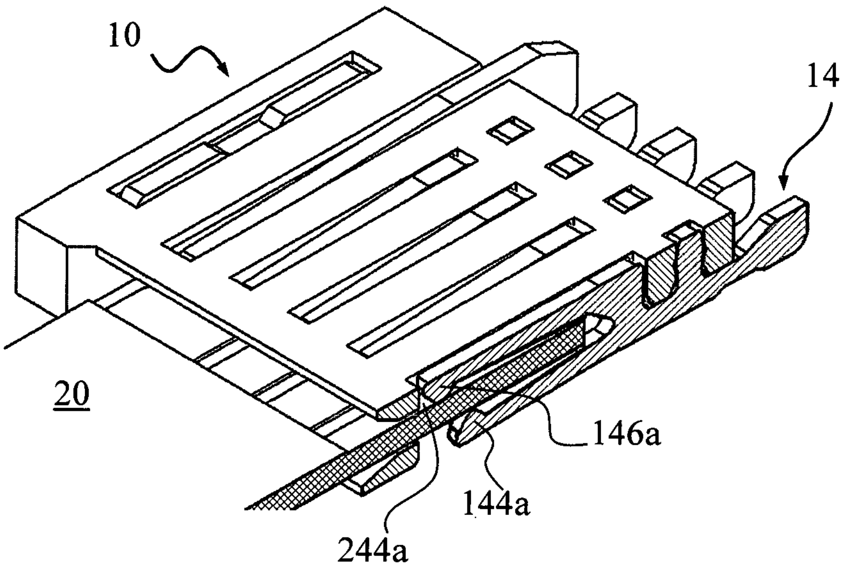
FIG. 10 is a perspective cross sectional view of FIG. 9 along C-C.
Figure 11:
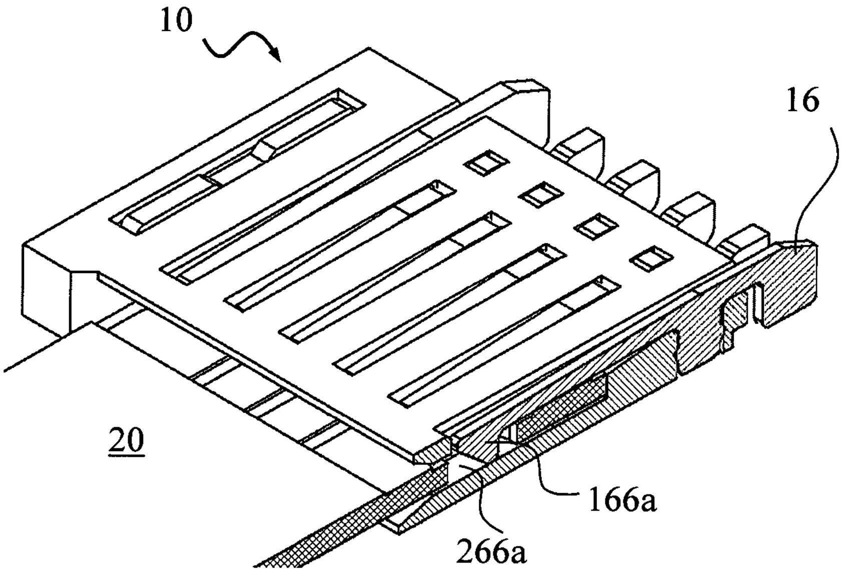
FIG. 11 is a perspective cross sectional view of FIG. 9 along D-D.

In use, as shown in FIGS. 8 to 11, an FPC 20 is inserted into cavity 12*e* of housing 12 from front side 12*a* to establish electrical connection with connector 10. As lower and upper arms 144, 146 and locking arm 166 are deflectable due to their elastic characteristics, during the insertion process, FPC 20 will cause lower arm 144 and upper arm 146 to deflect away from each other, hence contact portions 246*a* of FPC 20 can be positioned between lower arm 144 and upper arm 146, and become electrically connected to lower contact projection 144*a* and upper contact projection 146*a* (FIG. 10). During the insertion process, FPC 20 also pushes catching member 166*a* and causes locking arm 166 of locking member 16 to deflect upwardly. When FPC 20 is at the fully inserted position, as shown in FIG. 11, engagement notch 266*a* of FPC 20 is positioned under catching member 166*a* to allow locking arm 166 to resume to original position, such that catching member 166*a* engages FPC 20 at notch 266*a*. Disengagement or dropping off of FPC 20 from connector 10 can therefore be prevented.

Figure 12A:
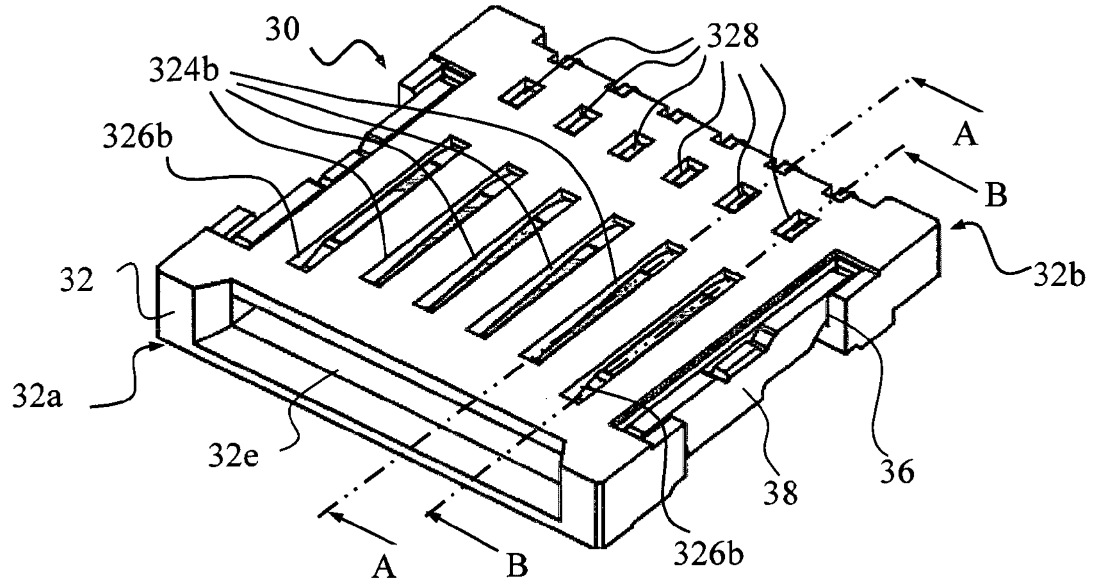
FIG. 12A is a perspective view showing an FPC connector according to another embodiment of the present invention.
Figure 12B:
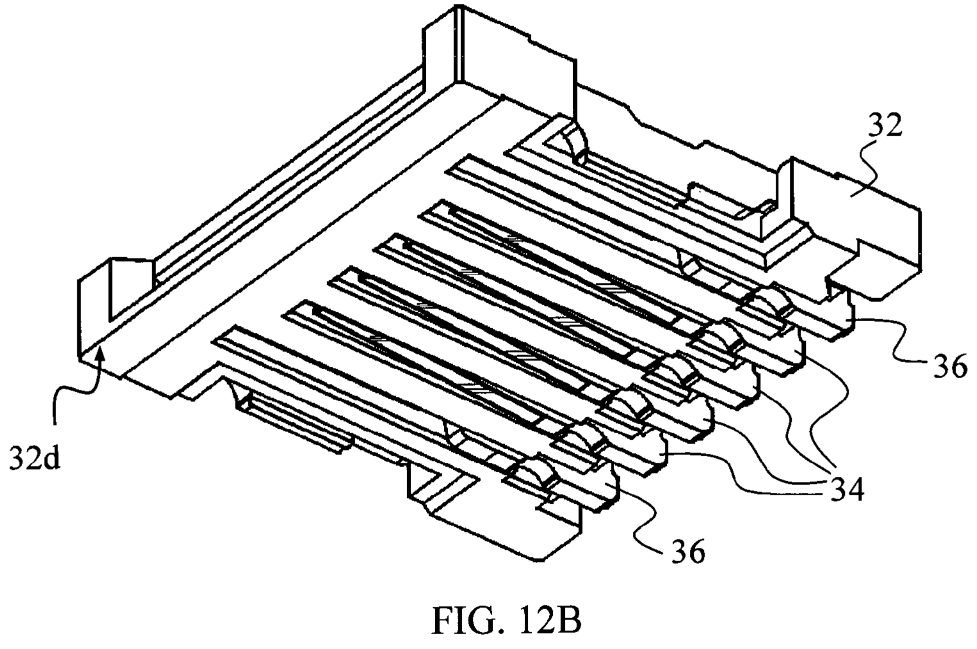
FIG. 12B is a perspective bottom view of FIG. 1A.
Figure 13:
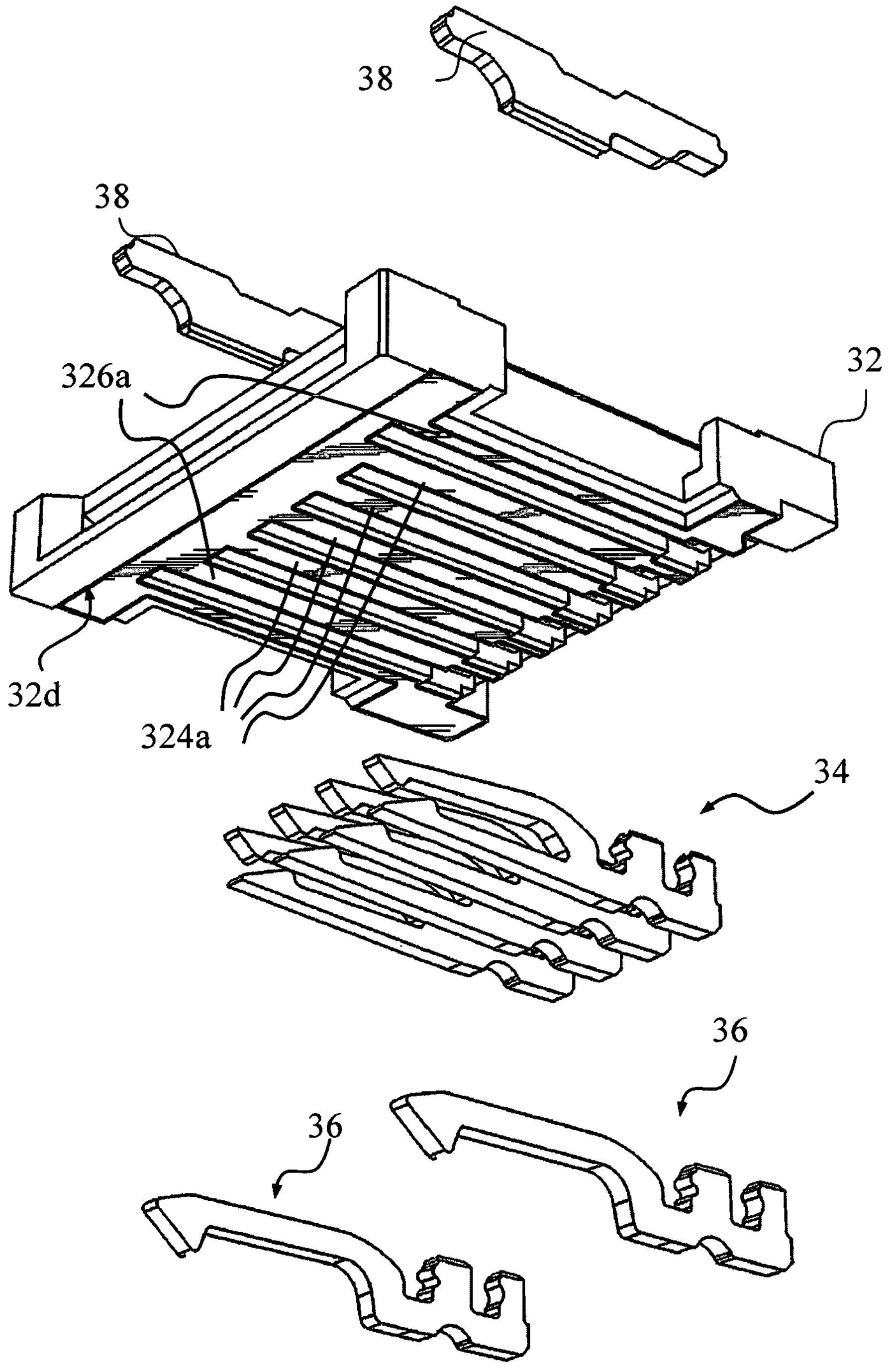
FIG. 13 is an exploded view of FIG. 12B.

As shown FIG. 12A, 12B and 13, an FPC connector 30 according to another embodiment of the present invention includes a housing 32, a plurality of contact elements 34, a pair of locking members 36 and a pair of hold downs 38 attached to housing 32. Housing 32 is made of molded plastic and has a front end 32*a*, back end 32*b*, top side 32*c* and bottom side 32*d*. Between top side 32*c* and bottom side 32*d* there is formed a cavity 32*e* for receiving an FPC therein to establish electrical connection with contact elements 34.

Housing 32 includes first contact grooves 324*a* and first fixing grooves 326*a* formed at bottom side 32*d*. Housing 32 also includes second contact grooves 324*b* and second fixing grooves 326*b* formed on top side 32*c*. Fixing holes 328 are formed in housing 32 from top side 32*c* through bottom side 32*d*.

Figure 14:
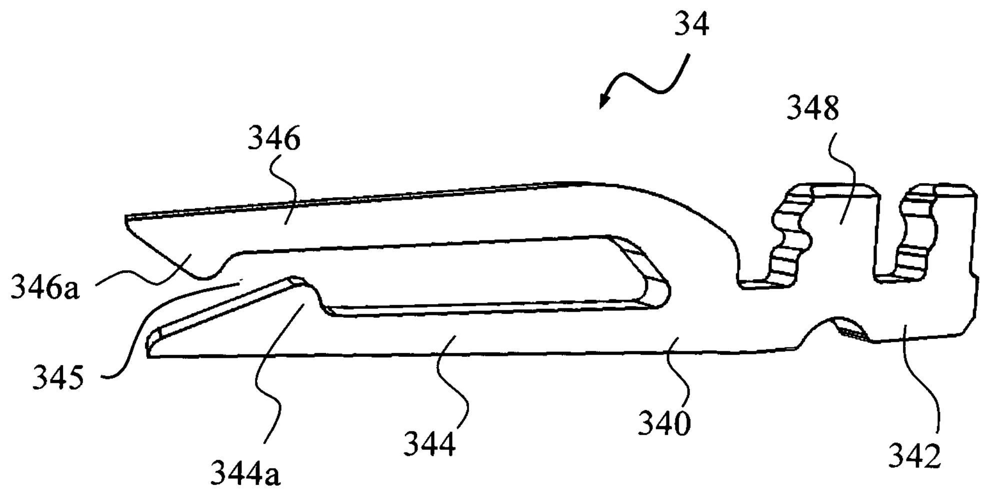
FIG. 14 is a perspective view showing a contact element of the FPC connector showing in FIG. 12A.

As shown in FIG. 14, contact element 34 has a base 340 and a tail 342 extending from base 340 toward a back side (right side in FIG. 14) of contact element 340. A lower arm 344 and an upper arm 346 extend from base 340 toward a front side (left side in FIG. 14) of contact element 34. Lower arm 344 has a lower contact projection 344*a* formed at a free end thereof, facing upper arm 346. Upper arm 346 has an upper contact projection 346*a* formed at a free end thereof, facing lower arm 344. Lower arm 344 and upper arm 346 form a space 345 therebetween, for receiving an FPC. A fixing projection 348 is formed on base 340 and extending upwardly from base 340.

Figure 15:
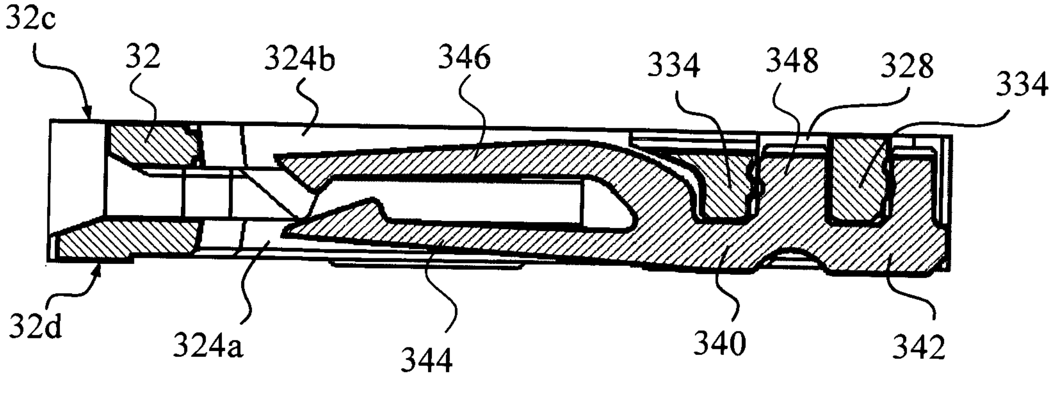
FIG. 15 is a cross sectional view of FIG. 12A along A-A.

To assemble to housing 32, as shown in FIG. 15, each contact element 34 is inserted and attached to housing 32 from bottom side 32*d* towards top side 32*c*, with fixing projection 348 inserted into fixing hole 328. During the insertion process, upper arm 346 passes through first contact groove 324*a* and cavity 32*e*. When fixing projection 348 is fully received in fixing hole 328, upper arm 346 is positioned in second contact groove 326*b*. Meanwhile, lower arm 344 is received in first contact groove 324 and tail 342 is positioned at back side 32*b* of housing 32. Base 340 becomes in contact with first stopper(s) 334 formed in housing 32, hence further movement of contact element 34 toward top side 32*c* is prevented. Lower arm 344 is elastically deflectable within first contact groove 324*a*. Likewise, upper arm 346 is elastically deflectable within second contact groove 324*b*.

Figure 16:
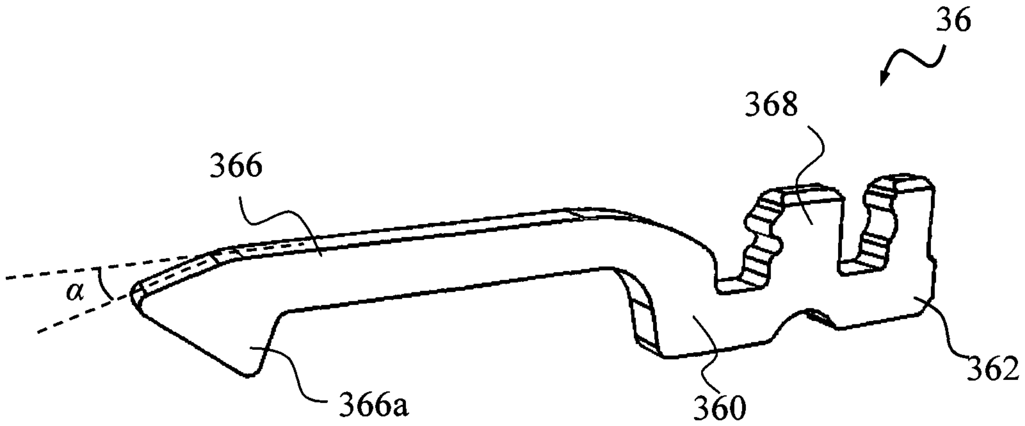
FIG. 16 is a perspective view showing a locking member of the FPC connector showing in FIG. 12A.

As shown in FIG. 16, locking member 36 includes a base 360 and a tail 362 extending backwardly from base 360. A locking arm 366 extends forwardly from base 360, and is offset from base 360 along a direction perpendicular to base 360. Locking arm 366 has a catch member 366*a* formed at the free end of locking arm 366, and faces downward. A locking projection 368 extends upwardly from base 360. The front end of locking arm 366 may be tapered, e.g. at a downward angle α.

Figure 17:
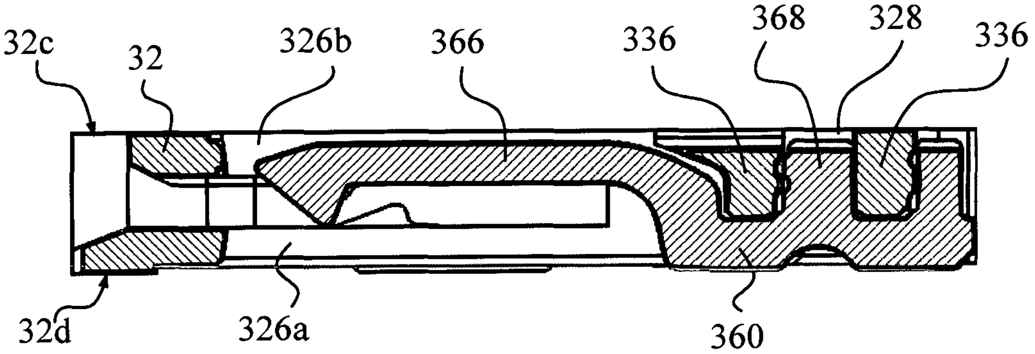
FIG. 17 is a cross sectional view of FIG. 12A along B-B.
Figure 18:
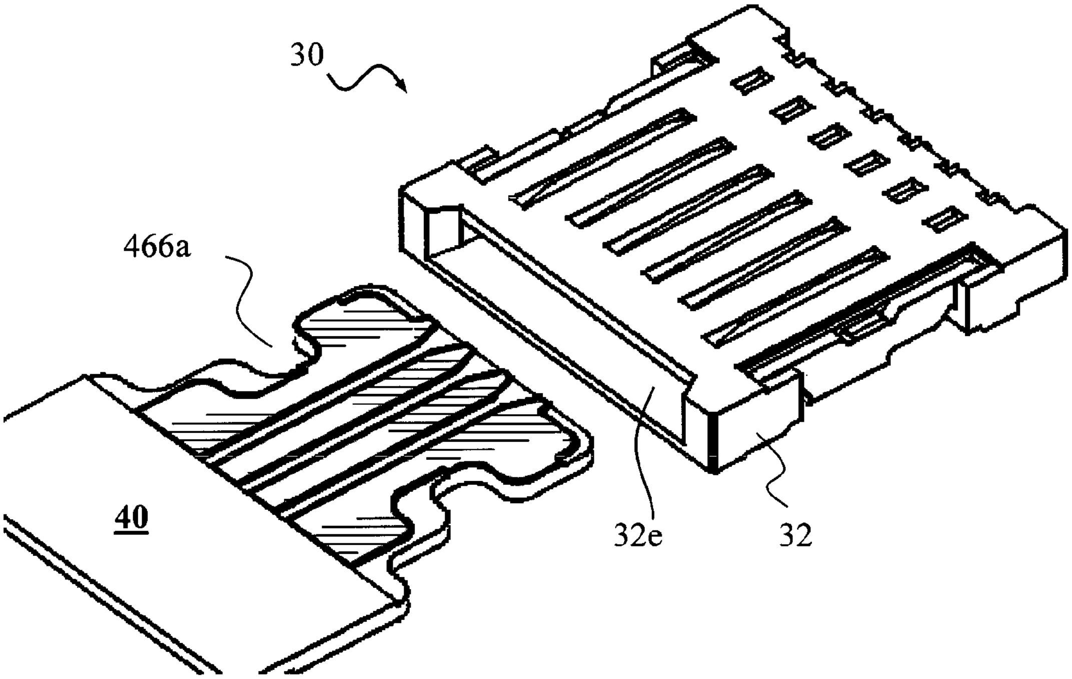
FIG. 18 is a perspective view showing an FPC to be connected to the FPC connector of FIG. 12A.
Figure 19:
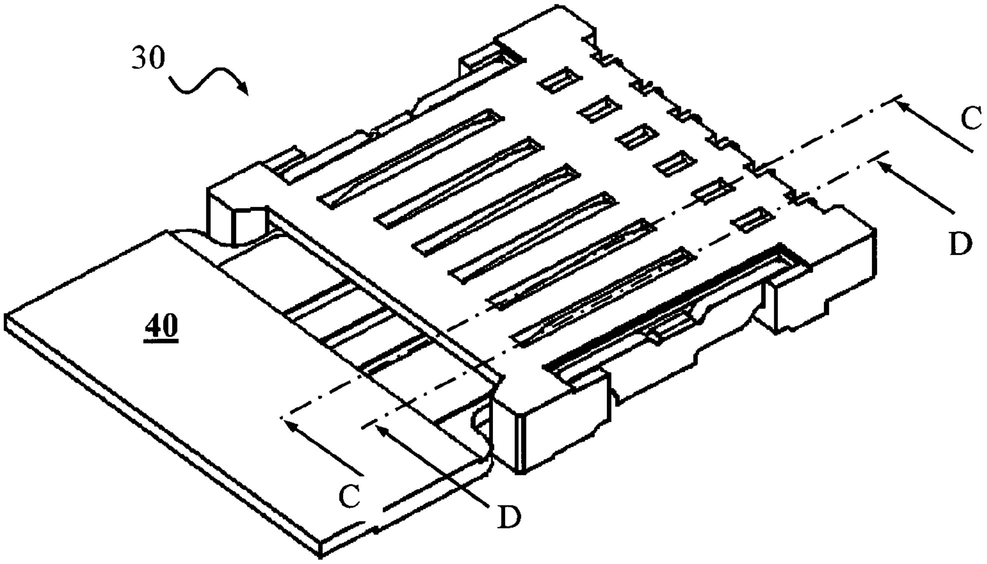
FIG. 19 is a perspective view showing an. FPC connected to the FPC connector of FIG. 12A.

To assemble to housing 34, as shown in FIG. 17, each locking member 36 is inserted into housing 32 from bottom side 32*d* along a direction towards top side 32*c*, with locking arm 366 passing through first fixing groove 326*a*, and locking projection 368 inserted into fixing hole 328 of housing 32. When locking projection 368 is fully received in fixing hole 328, locking arm 366 is positioned in second fixing groove 326*b* at top side of housing 32. At this position, catch member 366*a* is disposed in cavity 32*e* and faces downward. Base 360 becomes in contact with second stoppers 336 formed in housing 32, hence further insertion of locking member 36 toward top side 32*c* of housing 32 is prevented. Meanwhile, tail 362 is positioned at back side 32*b* of housing 32. Locking members 36 are attached to housing 32 in this manner, and locking arm 366 is allowed to deflect within second fixing groove 326*b*.

Figure 20:
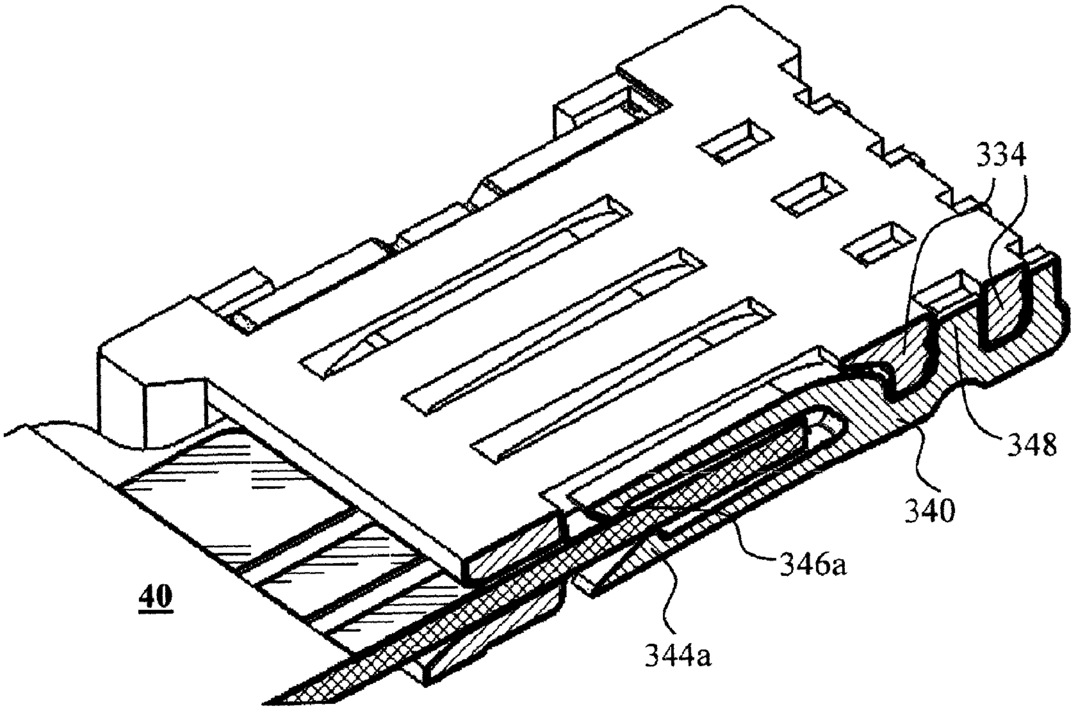
FIG. 20 is a perspective cross sectional view of FIG. 19 along C-C.

In use, as shown in FIGS. 18 to 21, an FPC 40 is inserted into cavity 32*e* of housing 32 from front side 32*a* to establish electrical connection with connector 30. As lower and upper arms 344, 346 and locking arm 366 are deflectable due to their elastic characteristics, during the insertion process, FPC 40 will cause lower arm 344 and upper arm 346 to deflect away from each other, hence contact portions 346*a* of FPC 40 can be positioned between lower arm 344 and upper arm 346, and is electrically connected to lower contact projection 344*a* and upper contact projection 346*a* (FIG. 20).

During the insertion process, FPC 40 also acts against catching member 366*a* and causes locking arm 366 of locking member 36 to deflect upwardly. As second stoppers 336 acts against base 360 of locking arm 36, upward-deflection of locking arm 366 will have a tendency to tighten the attachment of locking member 36 to housing 32. As such, movement of locking member 36 relative to housing 32, and/or detachment of locking member 36 from housing 32 during the insertion process of FPC to connector 30, is prevented.

Figure 21:
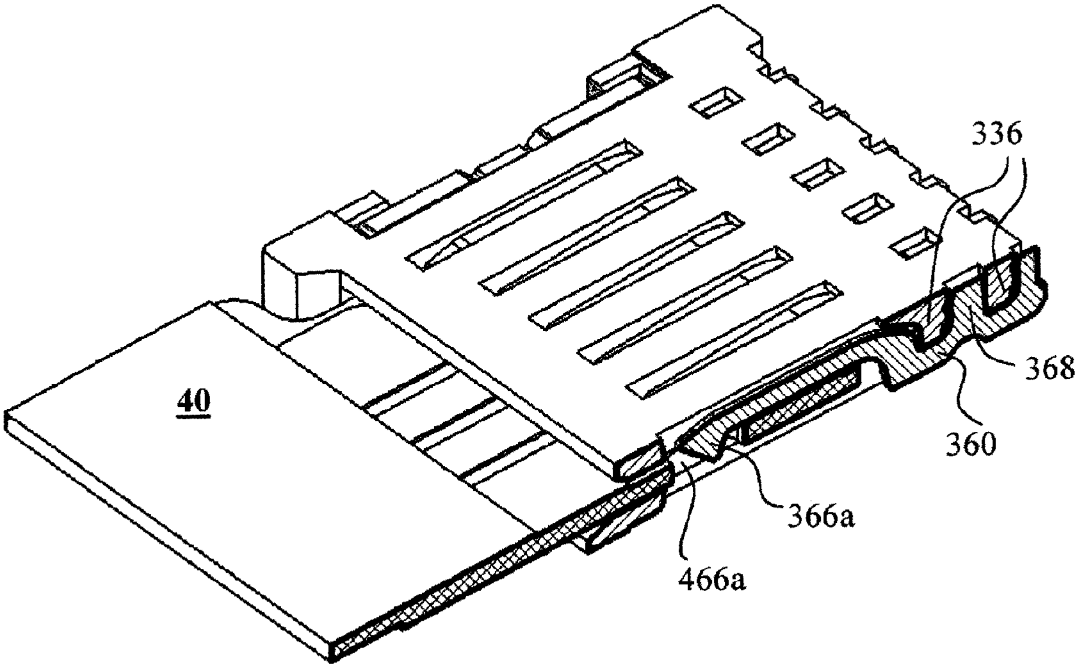
FIG. 21 is a perspective cross sectional view of FIG. 19 along D-D.

When FPC 40 is at the fully inserted position, as shown in FIG. 21, engagement notch 466*a* of FPC 40 is positioned under catching member 366*a* to allow locking arm 366 to resume to original position, such that catching member 366*a* engages FPC 40 at notch 466*a*. Disengagement or dropping off of FPC 40 from connector 30 can therefore be prevented and hence the electrical connection between FPC 40 and connector 30 is ensured.

Although embodiments of the present invention have been illustrated in conjunction with the accompanying drawings and described in the foregoing detailed description, it should be appreciated that the present invention is not limited to the embodiments disclosed. Therefore, the present invention should be understood to be capable of numerous rearrangements, modifications, alternatives and substitutions without departing from the spirit of the invention as set forth and recited by the following claims.

The invention claimed is:

1. An electrical connector, comprising:

a housing having a front end, a back end, a top side, a bottom side and a cavity between the top side and the bottom side, wherein the cavity is to receive a circuit board therein and the housing comprises a plurality of parallel grooves, with a first portion of the plurality of grooves comprising contact grooves and a second portion of the plurality of grooves comprising fixing grooves;

a plurality of contact elements disposed within the contact grooves and attached to the housing, each contact element having an upper contact arm disposed at the top side and a lower contact arm disposed at the bottom side;

a pair of locking members disposed within the fixing grooves and attached to the housing, each locking member having a lock arm positioned along a direction from the back end to the front end of the housing, wherein the upper contact arm and the lower contact arm of each contact element and the lock arm of each locking member being resiliently deflectable away from the cavity to allow insertion of the circuit board into the cavity, wherein when the circuit board is inserted into the cavity, the upper contact arm and the lower contact arm are in electrical contact with the circuit board, and the lock arm springs back to engage the circuit board and lock the circuit board to the housing, and wherein the contact elements and locking members each comprises a tail extending from the housing to form an array of parallel tails extending from the back end of the housing.

2. The electrical connector of claim 1, wherein each locking member has a base and a locking projection extending perpendicularly from the base, wherein the housing has a plurality of fixing holes, when the locking members are attached to the housing, the locking projection of each locking member is positioned in a fixing hole along a direction perpendicular to the top side and the bottom side of the housing.

3. The electrical connector of claim 2, wherein the fixing holes are positioned at the bottom side of the housing, wherein the lock arm of each locking member is in alignment with the base such that when the locking projection is inserted into the fixing hole from the top side of the housing, the base and the lock arm are positioned at the top side of the housing.

4. The electrical connector of claim 3, wherein each locking member further comprising a catch member formed at an end portion of the lock arm, the catch member extends from the lock arm along a direction the same as the locking projection.

5. The electrical connector of claim 4, wherein when the locking projection is positioned in the fixing hole, the locking projection faces the bottom side of the housing and the catch member is disposed in the cavity and faces the bottom side of the housing.

6. The electrical connector of claim 5, wherein when the circuit board is inserted into the cavity, the catch member engages the circuit board to prevent the detachment of the circuit board from the housing.

7. The electrical connector of claim 1, wherein the plurality of contact elements and the pair of locking members are planar members.

8. An electrical connector, comprising:

a housing having a front end, a back end, a top side, a bottom side and a cavity between the top side and the bottom side, wherein the cavity is to receive a circuit board therein;

a plurality of contact elements attached to the housing, each contact element having an upper contact arm disposed at the top side and a lower contact arm disposed at the bottom side;

a plurality of locking members attached to the housing, each locking member having a lock arm positioned along a direction from the back end to the front end of the housing, wherein the upper contact arm and the lower contact arm of each contact element and the lock arm of each locking member being resiliently deflectable away from the cavity to allow insertion of the circuit board into the cavity, and wherein when the circuit board is inserted into the cavity, the upper contact arm and the lower contact arm are in electrical contact with the circuit board, and the lock arm springs back to engage the circuit board and lock the circuit board to the housing, wherein each locking member has a base and a locking projection extending perpendicularly from the base, wherein the housing has a plurality of fixing holes, when the locking members are attached to the housing, the locking projection of each locking member is positioned in a fixing hole along a direction perpendicular to the top side and the bottom side of the housing, wherein the fixing holes are positioned at the top side of the housing, wherein the lock arm of each locking member is offset with respect to the base along a direction perpendicular to the base such that when the locking projection is inserted into the fixing hole from the bottom side of the housing, the base is positioned at the bottom side of the housing and the lock arm is positioned at the top side of the housing.

9. The electrical connector of claim 8, wherein each locking member further comprising a catch member formed at an end portion of the lock arm, the catch member extends from the lock arm along a direction opposite to the locking projection.

10. The electrical connector of claim 9, wherein when the locking projection is positioned in the fixing hole, the locking projection faces the top side of the housing and the catch member is disposed in the cavity and faces the bottom side of the housing.

11. The electrical connector of claim 10, wherein when the circuit board is inserted into the cavity, the catch member engages the circuit board to prevent the detachment of the circuit board from the housing.

* * * * *